US010812050B2

(12) United States Patent
Takamine

(10) Patent No.: US 10,812,050 B2
(45) Date of Patent: Oct. 20, 2020

(54) MULTIPLEXER, RADIO-FREQUENCY (RF) FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/745,611

(22) Filed: Jan. 17, 2020

(65) Prior Publication Data

US 2020/0153414 A1 May 14, 2020

Related U.S. Application Data

(63) Continuation of application No. PCT/JP2018/027060, filed on Jul. 19, 2018.

(30) Foreign Application Priority Data

Jul. 20, 2017 (JP) .................................. 2017-141349

(51) Int. Cl.
*H03H 9/72* (2006.01)
*H03H 9/145* (2006.01)
(Continued)

(52) U.S. Cl.
CPC ........ *H03H 9/725* (2013.01); *H03H 9/14538* (2013.01); *H03H 9/25* (2013.01); *H04B 1/0057* (2013.01)

(58) Field of Classification Search
CPC ............ H03H 9/145; H03H 9/25; H03H 9/72; H03H 9/725; H04B 1/0057
See application file for complete search history.

(56) References Cited

U.S. PATENT DOCUMENTS 8,487,720 B2* 7/2013 Fujiwara .................. H03H 9/64
333/195
2011/0215883 A1 9/2011 Fujiwara et al.
(Continued)

FOREIGN PATENT DOCUMENTS

JP 2011-182220 A 9/2011
JP 2016-119569 A 6/2016
(Continued)

OTHER PUBLICATIONS

Official Communication issued in International Patent Application No. PCT/JP2018/027060, dated Sep. 25, 2018.

*Primary Examiner* — Gregory B Sefcheck
*Assistant Examiner* — Debebe A Asefa
(74) *Attorney, Agent, or Firm* — Keating & Bennett, LLP

(57) ABSTRACT

A multiplexer includes a first reception-side filter and a second reception-side filter whose passband has frequencies higher than the first reception-side filter. The first reception-side filter includes a series arm resonator provided on a first path, and parallel arm resonators provided on a path electrically connecting the first path and ground. A direction connecting tips of a plurality of electrode fingers included in each resonator crosses an elastic wave propagating direction at a certain angle. The parallel arm resonator closest to a common connection terminal does not include third electrode fingers, and the other parallel arm resonators include third electrode fingers.

18 Claims, 10 Drawing Sheets

(51) Int. Cl.
    *H03H 9/25*         (2006.01)
    *H04B 1/00*         (2006.01)

(56)              References Cited

U.S. PATENT DOCUMENTS

| | | |
|---|---|---|
| 2016/0182010 A1 | 6/2016 | Nakamura et al. |
| 2016/0261038 A1* | 9/2016 | Tanaka ................ H03H 9/6456 |
| 2017/0047905 A1 | 2/2017 | Araki et al. |
| 2018/0109243 A1 | 4/2018 | Takamine |
| 2019/0123721 A1 | 4/2019 | Takamine |

FOREIGN PATENT DOCUMENTS

| | | |
|---|---|---|
| WO | 2015/064238 A1 | 5/2015 |
| WO | 2015/182522 A1 | 12/2015 |
| WO | 2016/208670 A1 | 12/2016 |
| WO | 2018/003272 A1 | 1/2018 |

\* cited by examiner

START 1500.00 MHz    STOP 2300.00 MHz

START 1500.00 MHz    STOP 2300.00 MHz

MULTIPLEXER, RADIO-FREQUENCY (RF) FRONT-END CIRCUIT, AND COMMUNICATION APPARATUS

CROSS REFERENCE TO RELATED APPLICATIONS

This application claims the benefit of priority to Japanese Patent Application No. 2017-141349 filed on Jul. 20, 2017 and is a Continuation Application of PCT Application No. PCT/JP2018/027060 filed on Jul. 19, 2018. The entire contents of each application are hereby incorporated herein by reference.

BACKGROUND OF THE INVENTION

1. Field of the Invention

The present invention relates to a multiplexer including an elastic wave filter, a radio-frequency (RF) front-end circuit, and a communication apparatus.

2. Description of the Related Art

Communication apparatuses such as cellular phone terminals in recent years are demanded to cope with a plurality of frequency bands and a plurality of wireless systems, namely, multi-bands and multi-modes, using one terminal. To cope with this, a multiplexer that isolates a radio-frequency (RF) signal with a plurality of wireless carrier frequencies is arranged immediately after an antenna of a communication apparatus. As a plurality of bandpass filters included in the multiplexer, elastic wave filters having low loss in their passbands and steepness of bandpass characteristics around the passbands are used (for example, see International Publication No. WO 2016/208670).

International Publication No. WO 2016/208670 discloses a surface acoustic wave device (SAW duplexer) with a configuration in which a plurality of SAW filters are connected to a common connection terminal. In this SAW device, impedance in the case of viewing a first SAW filter from the common connection terminal side has, as its complex conjugate, combined impedance in the case of viewing one or more SAW filters other than the first SAW filter from the common connection terminal side, thereby matching the impedance of the SAW device viewed from the common connection terminal side to a characteristic impedance. Accordingly, deterioration of insertion loss of the SAW device is reduced.

In the SAW device according to the related art, in order to provide the impedance of the first SAW filter viewed from the common connection terminal side nearer to a short side, the capacitance of a parallel arm resonator provided at a position closest to the common connection terminal, among a plurality of parallel arm resonators, is made greater than the other parallel arm resonator(s). Due to this, in order not to deteriorate the steepness on the lower frequency side of the passband of the first SAW filter, the resonant frequency of the parallel arm resonator provided at a position closest to the common connection terminal, among the plurality of parallel arm resonators, is made lower than the resonant frequency of the other parallel arm resonator(s). Therefore, stopband ripples that should be generated in a stopband on the higher frequency side outside the passband are generated at a higher frequency end within the passband, and the bandwidth of the passband of this SAW filter becomes narrower.

SUMMARY OF THE INVENTION

Preferred embodiments of the present invention provide multiplexers, RF front-end circuits, and communication apparatuses that are each able to significantly reduce or prevent the narrowing of the bandwidth of the passband of a SAW filter.

A multiplexer according to a preferred embodiment of the present invention includes a common connection terminal, a first terminal, and a second terminal; a first filter provided on a first path electrically connecting the common connection terminal and the first terminal; and a second filter provided on a second path electrically connecting the common connection terminal and the second terminal. The first filter includes one or more series arm resonators provided on the first path; and two or more parallel arm resonators provided on a path electrically connecting the first path and ground. Each of the one or more series arm resonators and the two or more parallel arm resonators includes an IDT electrode and a reflector provided on a substrate, and the IDT electrode includes a pair of comb-shaped electrodes. The IDT electrode included in each of the two or more parallel arm resonators includes a plurality of first electrode fingers and a plurality of second electrode fingers that interdigitate with the first electrode fingers. A direction connecting tips of the plurality of first electrode fingers and a direction connecting tips of the plurality of second electrode fingers intersect an elastic wave propagating direction. The IDT electrode included in the two or more parallel arm resonators includes, among the plurality of first electrode fingers and the plurality of second electrode fingers, at least one of third electrode fingers whose electrode finger width at the tip is wider than an electrode finger width at a center portion, and fourth electrode fingers whose electrode finger width at the tip is less than or equal to an electrode finger width at a center portion. A ratio of a number of the fourth electrode fingers of the plurality of first electrode fingers and the plurality of second electrode fingers included in a parallel arm resonator closest to the common connection terminal among the two or more parallel arm resonators is higher than a ratio of a number of the fourth electrode fingers of the plurality of first electrode fingers and the plurality of second electrode fingers included in another or other parallel arm resonators among the two or more parallel arm resonators.

In a one-port SAW resonator including a piezoelectric layer, stopband ripples are generated between the resonant frequency and the anti-resonant frequency, and the frequencies become lower, which may deteriorate the transmission characteristics in the passband. To reduce or prevent this, an apodization-weighting IDT electrode in which the cross width of the IDT electrode is weighted is provided such that a direction connecting tips opposite to one end of a plurality of electrode fingers of the IDT electrode, each connected to a corresponding busbar electrode, crosses an elastic wave propagating direction. In combination with this apodization-weighting IDT, in order to significantly improve the insertion loss within the passband, variant fingers each of whose electrode finger width at the tip of the electrode finger is wider than the electrode finger width at the center portion of the electrode finger are provided. With this configuration, the occurrence of transverse mode ripples can be significantly reduced or prevented in the IDT electrode.

In addition, in a first filter including one-port SAW resonators in each of which an apodization-weighting IDT electrode and a variant finger are used, regarding a parallel arm resonator closest to the common connection terminal of the first filter, a ratio of a number of the variant finger(s) to all the electrode fingers included in the parallel arm resonator is lower than a ratio of a number of the variant finger(s) in another or other parallel arm resonators among the two or more parallel arm resonators. With this configuration, compared with the case in which all the parallel arm resonators included in the first filter have an equivalent ratio of the number of variant fingers, deterioration of the filter characteristics of the first filter can be significantly reduced or prevented on the higher frequency side of the passband.

In addition, because an IDT electrode of each resonator is provided on a multilayer-structure substrate including IDTs, a piezoelectric film, a low-acoustic-velocity film, a high-acoustic-velocity film, and a supporting substrate, the Q value of each resonator including the IDT electrode can be maintained at a high value.

Accordingly, the narrowing of the bandwidth of the passband of the SAW filter can be significantly reduced or prevented.

In addition, a number of the third electrode fingers included in the parallel arm resonator closest to the common connection terminal among the two or more parallel arm resonators may be less than a number of the third electrode fingers included in the another or other parallel arm resonators among the two or more parallel arm resonators.

Accordingly, because the ratio of the number of variant fingers in the parallel arm resonator closest to the common connection terminal of the first filter is lower than the ratio of the number of variant fingers in the another or other parallel arm resonators among the two or more parallel arm resonators, and the number of variant fingers included in the parallel arm resonator closest to the common connection terminal of the first filter is less than the number of variant fingers in the another or other parallel arm resonators among the two or more parallel arm resonators, ripples in the passband can be effectively reduced or prevented even if each IDT electrode included in each parallel arm resonator has different electrode parameters, for example, the number of pairs and the cross width. Therefore, the narrowing of the bandwidth of the passband of the SAW filter can be significantly reduced or prevented.

In addition, the IDT electrode of the parallel arm resonator closest to the common connection terminal among the two or more parallel arm resonators may not include the third electrode finger, and the IDT electrode of the another or other parallel arm resonators may include the third electrode finger.

Accordingly, ripples in the passband can be significantly reduced or prevented most effectively. Therefore, the narrowing of the bandwidth of the passband of the SAW filter can be significantly reduced or prevented.

In addition, a direction connecting tips of the plurality of first electrode fingers and a direction connecting tips of the plurality of second electrode fingers may not cross each other.

By using a slanted IDT in which a direction connecting the tips of the plurality of first electrode fingers of the IDT electrode does not cross a direction connecting the tips of the plurality of second electrode fingers, the occurrence of transverse mode ripples can be significantly reduced or prevented, and deterioration of the transmission characteristics in the passband can be significantly reduced or prevented. Therefore, the narrowing of the bandwidth of the passband of the SAW filter can be significantly reduced or prevented.

In addition, the multiplexer may include a first inductance element electrically connected to a connection path between an antenna connection terminal electrically connected to an antenna and the common connection terminal.

Accordingly, the complex impedance of the multiplexer viewed from the common terminal can be finely adjusted.

In addition, the multiplexer may include a second inductance element electrically connected in series to a connection path between the common connection terminal and the first filter.

Accordingly, because the impedance of a filter whose passband is a band outside the passband of the first filter becomes inductive, the complex impedance of the multiplexer viewed from the common connection terminal can be finely adjusted toward the inductive side. In addition, using the complex conjugate relationship, the complex impedance of the multiplexer viewed from the common connection terminal can be adjusted to a characteristic impedance.

In addition, the first filter may have a ladder filter structure including the one or more series arm resonators and the two or more parallel arm resonators.

Accordingly, ripples in the passband can be significantly reduced or prevented while securing low loss in the first filter. Therefore, the narrowing of the bandwidth of the passband of the SAW filter can be significantly reduced or prevented.

In addition, the first filter may further include a longitudinally-coupled filter structure provided on the first path.

Accordingly, the multiplexer can adapt to predetermined filter characteristics, for example, enhancement of attenuation.

In addition, the substrate may include a piezoelectric layer including a main surface on which the IDT electrode is provided; a high-acoustic-velocity supporting substrate in which an acoustic velocity of bulk waves propagating through the high-acoustic-velocity supporting substrate is higher than an acoustic velocity of elastic waves propagating through the piezoelectric layer; and a low-acoustic-velocity film provided between the high-acoustic-velocity supporting substrate and the piezoelectric layer, in which an acoustic velocity of bulk waves propagating through the low-acoustic-velocity film is lower than an acoustic velocity of elastic waves propagating through the piezoelectric layer.

Accordingly, the Q value of each resonator including the IDT electrode provided on the substrate including the piezoelectric layer can be maintained at a high value.

In addition, the multiplexer may include a first duplexer including two filters including the first filter, and a second duplexer.

Accordingly, ripples in the passband can be significantly reduced or prevented in the multiplexer including a plurality of duplexers. Therefore, the narrowing of the bandwidth of the passband of the SAW filter can be significantly reduced or prevented.

In addition, a radio-frequency (RF) front-end circuit according to a preferred embodiment of the present invention includes a multiplexer according to a preferred embodiment of the present invention; and an amplifier circuit electrically connected to the multiplexer.

Accordingly, an RF front-end circuit that can significantly reduce or prevent ripples in the passband and that can significantly reduce or prevent the narrowing of the bandwidth of the passband of a SAW filter is provided.

In addition, a communication apparatus according to a preferred embodiment of the present invention includes an RF signal processing circuit that processes a radio frequency signal transmitted and received by an antenna element; and a radio-frequency (RF) front-end circuit according to a preferred embodiment of the present invention, the RF front-end circuit transferring the radio frequency signal between the antenna element and the RF signal processing circuit.

Accordingly, a communication apparatus that can significantly reduce or prevent ripples in the passband and that can significantly reduce or prevent the narrowing of the bandwidth of the passband of a SAW filter is provided.

With multiplexer, RF front-end circuits, and communication apparatuses according to preferred embodiments of the present invention, the narrowing of the bandwidth of the passband of a SAW filter can be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
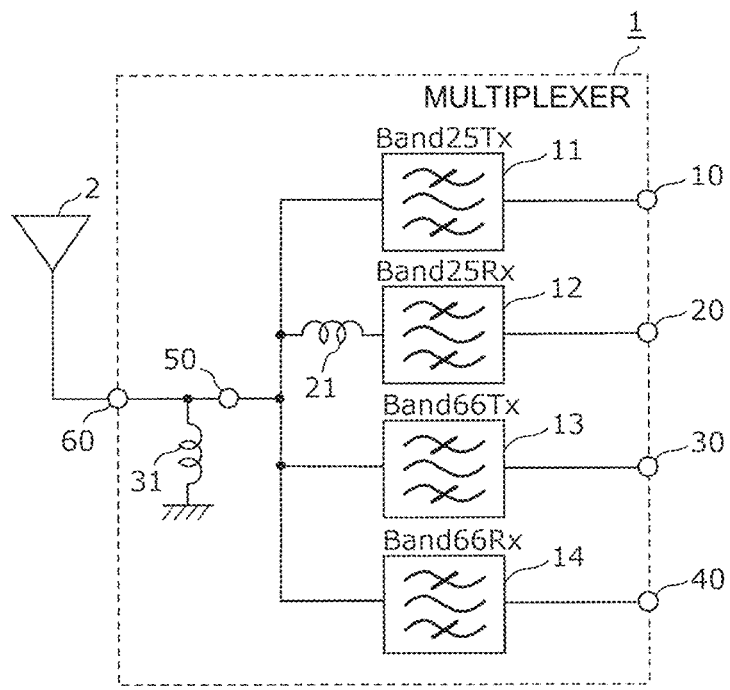
FIG. 1 is a circuit diagram of a multiplexer according to a first preferred embodiment of the present invention.

Hereinafter, preferred embodiments of the present invention will be described in detail with reference to the drawings. Note that all of the preferred embodiments described below show comprehensive or specific examples. Numerals, shapes, materials, elements, and the arrangement and connection configuration of the elements described in the following preferred embodiments are only exemplary and are not construed to limit the present invention. Among the elements in the following preferred embodiments, elements that are not described in independent claims are described as arbitrary or optional elements. In addition, the sizes or size ratios of elements shown in the drawings are not necessarily precise.

First Preferred Embodiment

1. Basic Configuration of Multiplexer

In a first preferred embodiment of the present invention, a quadplexer applied to the following will be described: Band 25 (transmission passband: about 1850 to about 1915 MHz, and reception passband: about 1930 to about 1995 MHz), and Band 66 (transmission passband: about 1710 to about 1780 MHz, and reception passband: about 2010 to about 2200 MHz) of the TD-LTE (Time Division Long Term Evolution) standard.

A multiplexer 1 according to the first preferred embodiment is preferably a quadplexer in which, for example, a Band-25 duplexer and a Band-66 duplexer are electrically connected by a common connection terminal 50.

FIG. 1 is a circuit diagram of the multiplexer 1 according to the first preferred embodiment. As shown in FIG. 1, the multiplexer 1 includes transmission-side filters 11 and 13, reception-side filters 12 and 14, an inductance element 21, transmission input terminals 10 and 30, reception output terminals 20 and 40, a common connection terminal 50, and an antenna connection terminal 60. The transmission-side filter 11 and the reception-side filter 12 define the Band-25 duplexer, which is a first duplexer. The transmission-side filter 13 and the reception-side filter 14 define the Band-66 duplexer, which is a second duplexer.

In addition, the multiplexer 1 is electrically connected to an antenna element 2 at the antenna connection terminal 60. An inductance element 31 is electrically connected between a connection path between the antenna connection terminal 60 and the common connection terminal 50 and ground, which is a reference terminal. In the first preferred embodiment, the inductance element 31 is a first inductance element. Accordingly, the complex impedance of the multiplexer viewed from the common terminal can be finely adjusted. Note that the inductance element 31 may be electrically connected in series to a connection path between the antenna connection terminal 60 and the common connection terminal 50. By electrically connecting the first inductance element with a small inductance value between the common terminal and the antenna element, the complex impedance of the multiplexer viewed from the common terminal can be finely adjusted toward an inductive side. In addition, the inductance element 31 may be included in the multiplexer 1, or the inductance element 31 may be externally electrically connected to the multiplexer 1.

The transmission-side filter 11 is an unbalanced-input and unbalanced-output bandpass filter that receives, via the transmission input terminal 10, a transmission wave generated by a transmission circuit (for example, an RFIC), filters the transmission wave with the transmission passband (for example, about 1850 to about 1915 MHz: first passband) of Band 25, and outputs the filtered wave to the common connection terminal 50. The transmission-side filter 11 is a second filter.

The reception-side filter 12 is an unbalanced-input and unbalanced-output bandpass filter that receives a reception wave input from the common connection terminal 50, filters the reception wave with the reception passband (for example, about 1930 to about 1995 MHz: second passband) of Band 25, and outputs the filtered wave to the reception output terminal 20. The reception-side filter 12 is a first filter.

In addition, the inductance element 21 is electrically connected in series between the reception-side filter 12 and the common connection terminal 50. In the first preferred embodiment, the inductance element 21 is a second inductance element. By electrically connecting the inductance element 21 to the common connection terminal 50 side of the reception-side filter 12, the impedance in the passband of the reception-side filter 12, which corresponds to the passbands of the transmission-side filters 11 and 13 and the reception-side filter 14 whose passbands are bands outside the passband of the reception-side filter 12, becomes inductive.

The transmission-side filter 13 is an unbalanced-input and unbalanced-output bandpass filter that receives, via the transmission input terminal 30, a transmission wave generated by a transmission circuit (for example, an RFIC), filters the transmission wave with the transmission passband (for example, about 1710 to about 1780 MHz: third passband) of Band 66, and outputs the filtered wave to the common connection terminal 50. The transmission-side filter 13 is a second filter.

The reception-side filter 14 is an unbalanced-input and unbalanced-output bandpass filter that receives a reception wave input from the common connection terminal 50, filters the reception wave with the reception passband (for example, about 2010 to about 2200 MHz: fourth passband) of Band 66, and outputs the filtered wave to the reception output terminal 40. The reception-side filter 14 is a second filter.

The transmission-side filters 11 and 13 and the reception-side filter 14 are directly electrically connected to the common connection terminal 50.

The transmission input terminals 10 and 30 and the reception output terminals 20 and 40 correspond to the transmission-side filters 11 and 13 and the reception-side filters 12 and 14, respectively. In addition, the transmission input terminals 10 and 30 and the reception output terminals 20 and 40 are electrically connected to an RF signal processing circuit (for example, RFIC: Radio Frequency Integrated Circuit, not shown) via an amplifier circuit or the like (not shown), outside the multiplexer 1.

Note that the inductance element 21 is not restricted to being provided between the reception-side filter 12 and the common connection terminal 50, and may be electrically connected in series between the reception-side filter 14 and the common connection terminal 50.

2. Basic Configuration of Filters

Next, the basic configuration of the transmission-side filters 11 and 13 and the reception-side filters 12 and 14 will be described by describing, for example, the basic configuration of the reception-side filter 12 whose passband is Band 25. Rx.

Figure 2:
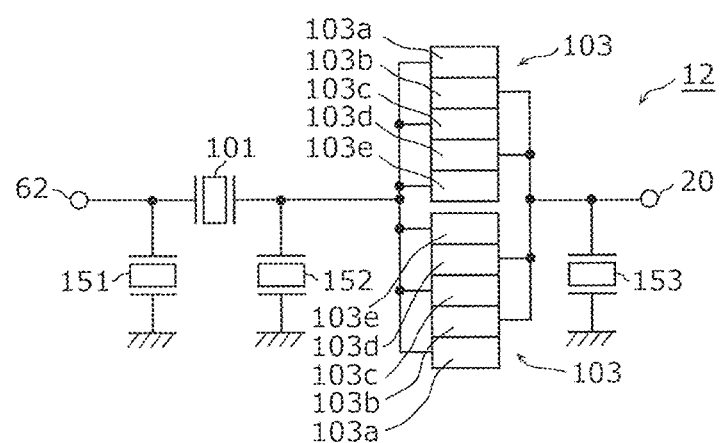
FIG. 2 is a circuit diagram of a Band-25 reception-side filter included in the multiplexer according to the first preferred embodiment of the present invention.

FIG. 2 is a circuit diagram of the Band-25 reception-side filter 12 included in the multiplexer 1 according to the first preferred embodiment. As shown in FIG. 2, the reception-side filter 12 includes a series arm resonator 101, parallel arm resonators 151 to 153, and a longitudinally-coupled filter portion including two longitudinally-coupled filter portions 103 that are electrically connected in parallel.

The series arm resonator 101 is electrically connected in series to a first path (series arm) electrically connecting a reception input terminal 62 and the reception output terminal 20. In addition, the parallel arm resonators 151 to 153 are respectively electrically connected in parallel with each other to paths (parallel arms) electrically connecting connection points and reference terminals (ground), and these connection points are between the reception input terminal 62 and the series arm resonator 101, between the series arm resonator 101 and the longitudinally-coupled filter portion, and between the longitudinally-coupled filter portion and the reception output terminal 20. The parallel arm resonators 151 to 153 are directly electrically connected to the reference terminals, respectively. With the above-described connections of the series arm resonator 101 and the parallel arm resonators 151 to 153, the reception-side filter 12 has a ladder bandpass filter.

The longitudinally-coupled filter portions 103 each have a longitudinally-coupled filter structure provided between the reception input terminal 62 and the reception output terminal 20. The longitudinally-coupled filter portions 103 are two longitudinally-coupled filter portions 103 arranged in parallel on the reception output terminal 20 side of the series arm resonator 101. Each of the longitudinally-coupled filter portions 103 includes, for example, five IDTs 103a to 103e and reflectors (not shown) arranged at two end portions thereof. Note that the reflectors are not shown in FIG. 2. The position at which the longitudinally-coupled filter portions 103 are arranged is not restricted to the above-described position, and may be, for example, between the reception input terminal 62 and the series arm resonator 101.

The reception input terminal 62 is electrically connected to the common connection terminal 50 (see FIG. 1) with the inductance element 21 (see FIG. 1) provided therebetween. In addition, as shown in FIG. 2, the reception input terminal 62 is electrically connected to the parallel arm resonator 151.

Accordingly, the reception-side filter 12 includes a ladder filter structure including one or more series arm resonators (the series arm resonator 101 in the first preferred embodiment) arranged on a first path, and two or more parallel arm resonators (three parallel arm resonators 151 to 153 in the first preferred embodiment) arranged respectively on paths electrically connecting the first path and reference terminals (ground), and a longitudinally-coupled filter portion.

Note that the number of series arm resonators and the number of parallel arm resonators in the reception-side filter 12 are not restricted to those described above, and it is sufficient if there are one or more series arm resonators and two or more parallel arm resonators.

In addition, the parallel arm resonators 151 to 153 may each be electrically connected to the reference terminal with an inductance element provided therebetween. In addition, an impedance element, for example, an inductance element or a capacitance element may be inserted or electrically connected to the series arm or each of the parallel arms.

In addition, although the parallel arm resonators 151 to 153 are electrically connected to the individual reference terminals (ground) in the reception-side filter 12 shown in FIG. 2, the parallel arm resonators 151 to 153 may be electrically connected to a common reference terminal. A common reference terminal and individual reference terminals may be arbitrarily selected in accordance with, for example, the mounting layout restrictions of the reception-side filter 12.

Note that the transmission-side filters 11 and 13 and the reception-side filter 14 are not restricted to the above-described features, and may be arbitrarily designed in accordance with the predetermined filter characteristics and the like. Specifically, the transmission-side filters 11 and 13 and the reception-side filter 14 may or may not include a ladder filter structure. In addition, the transmission-side filters 11 and 13 and the reception-side filter 14 may or may not include a longitudinally-coupled filter structure. In addition, each of resonators included in the transmission-side filters 11 and 13 and the reception-side filter 14 is not restricted to a SAW resonator, and may be, for example, a BAW (Bulk Acoustic Wave) resonator. Furthermore, the transmission-side filters 11 and 13 and the reception-side filter 14 may not include resonators, and may be, for example, LC resonance filters or dielectric filters.

3. Basic Configuration of Resonator

Next, the basic configuration of each of the resonators (series arm resonator and parallel arm resonators) included in the reception-side filter 12 will be described. In the first preferred embodiment, the resonators are preferably surface acoustic wave (SAW: Surface Acoustic Wave) resonators, for example.

Figure 3A:
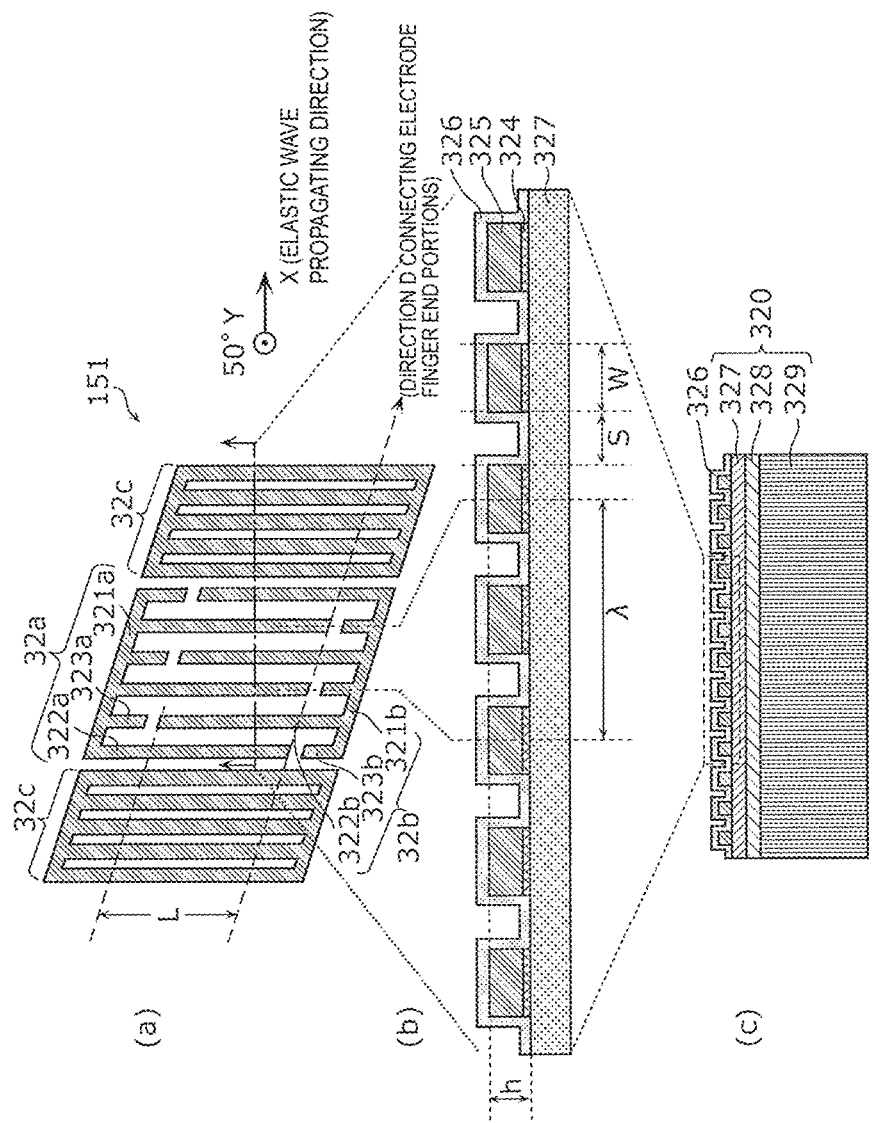
FIG. 3A includes diagrams representing a resonator in the Band-25 reception-side filter according to the first preferred embodiment of the present invention, and part (a) is a plan view, and parts (b) and (c) are sectional views.

FIG. 3A includes diagrams representing a resonator in the Band-25 reception-side filter 12 according to the first preferred embodiment, and part (a) of FIG. 3A is a plan view, and parts (b) and (c) of FIG. 3A are sectional views. Part (b) of FIG. 3A is an enlarged view of a portion of part (c) of FIG. 3A. Parts (a) to (c) of FIG. 3A show, among a plurality of resonators included in the reception-side filter 12, a plan view and sectional views representing the structure of the parallel arm resonator 151, which is closest to the common connection terminal 50. Note that the parallel arm resonator 151 shown in parts (a) to (c) of FIG. 3A is included to show a typical structure of the above-described plurality of resonators, and the number and length of electrode fingers included in an electrode are not restricted to those of the parallel arm resonator 151.

As shown in part (a) of FIG. 3A, the parallel arm resonator 151 includes a pair of comb-shaped electrodes 32a and 32b facing each other, and reflectors 32c arranged in an elastic wave propagating direction of the pair of comb-shaped electrodes 32a and 32b. The pair of comb-shaped electrodes 32a and 32b defines an IDT (Inter Digital Transducer) electrode. Note that one of the paired reflectors 32c may not be provided, depending on the mounting layout restrictions or the like.

The comb-shaped electrode 32a is arranged in the shape of comb teeth, and includes a plurality of electrode fingers 322a and a plurality of offset electrode fingers 323a that are parallel or substantially parallel to each other, and a busbar electrode 321a connecting end portions of the plurality of electrode fingers 322a and end portions of the plurality of offset electrode fingers 323a. In the first preferred embodiment, the plurality of electrode fingers 322a are first electrode fingers.

In addition, the comb-shaped electrode 32b is arranged in the shape of comb teeth, and includes a plurality of electrode fingers 322b and a plurality of offset electrode fingers 323b that are parallel or substantially parallel to each other, and a busbar electrode 321b connecting end portions of the plurality of electrode fingers 322b and end portions of the plurality of offset electrode fingers 323b. In the first preferred embodiment, the plurality of electrode fingers 322b are second electrode fingers.

The pluralities of electrode fingers 322a and 322b and the pluralities of offset electrode fingers 323a and 323b extend in a direction orthogonal or substantially orthogonal to the elastic wave propagating direction (X-axis direction). In addition, the electrode fingers 322a and the offset electrode fingers 323b face each other in the orthogonal or substantially orthogonal direction, and the electrode fingers 322b and the offset electrode fingers 323a face each other in the orthogonal or substantially orthogonal direction. In addition, the plurality of electrode fingers 322a and the plurality of electrode fingers 322b are arranged alternately in the elastic wave propagating direction (X-axis direction). In other words, the plurality of electrode fingers 322a and the plurality of electrode fingers 322b are interdigitated with each other.

Here, a direction D connecting tips of the plurality of electrode fingers 322a (end portions of the plurality of electrode fingers 322a that are not connected to the busbar electrode 321a) intersects the elastic wave propagating direction (X-axis direction) at an angle. In addition, a direction D connecting tips of the plurality of electrode fingers 322b (end portions of the plurality of electrode fingers 322b that are not connected to the busbar electrode 321b) intersects the elastic wave propagating direction (X-axis direction) at an angle. In short, each IDT electrode included in the parallel arm resonator 151 is an apodization-weighting IDT in which the cross width is weighted, and the elastic wave propagating direction and a direction in which the plurality of electrode fingers are arranged cross each other. Furthermore, the parallel arm resonator 151 shown in part (a) of FIG. 3A includes a slanted IDT in which a direction connecting the tips of the electrode fingers 322a and a direction connecting the tips of the electrode fingers 322b do not cross each other. Similar to the parallel arm resonator 151, each IDT electrode included in the series arm resonator 101 and the parallel arm resonators 152 and 153 is a slanted IDT.

In a one-port SAW resonator including a piezoelectric layer, transverse mode ripples are generated between the resonant frequency and the anti-resonant frequency, and this may deteriorate the transmission characteristics in the passband. As a measure against this, in the reception-side filter 12 according to the first preferred embodiment, a slanted IDT is used as an IDT electrode in each resonator. Note that the series arm resonator 101 and the parallel arm resonators 151 to 153 are not restricted to slanted IDT electrodes, and may be apodization-weighting IDT electrodes in which the cross width is weighted, and a direction connecting the tips of the electrode fingers 322a and a direction connecting the tips of the electrode fingers 322b cross each other. For example, an apodization-weighting IDT electrode may be used, in which the cross width is weighted, and the cross width decreases from one end to the other end in the elastic wave propagating direction of the IDT electrode.

The paired reflectors 32c are arranged in the direction D for the pair of comb-shaped electrodes 32a and 32b. Specifically, the paired reflectors 32c sandwich the pair of comb-shaped electrodes 32a and 32b in the direction D.

Each of the reflectors 32c includes a grating structure. Reflector busbar electrodes of the paired reflectors 32c are provided along the direction D.

The paired reflectors 32c structured as described above are able to confine standing waves of the propagating elastic waves without leaking them to the outside of the resonator (here, the parallel arm resonator 151). In doing so, the resonator can propagate RF signals in the passband defined by the electrode pitch, the number of pairs, the cross width, and so forth of the pair of comb-shaped electrodes 32a and 32b with low loss while highly attenuating RF signals outside the passband.

In addition, the IDT electrode including the pair of comb-shaped electrodes 32a and 32b (the pluralities of electrode fingers 322a and 322b, the pluralities of offset electrode fingers 323a and 323b, and the busbar electrodes 321a and 321b) has a multilayer structure including an adhesion layer 324 and a main electrode layer 325, as shown in part (b) of FIG. 3A. In addition, because the cross-sectional structure of the reflectors 32c is the same or substantially the same as the cross-sectional structure of the IDT electrode, a description thereof will be omitted below.

The adhesion layer 324 is a layer that significantly improves the adhesion between a piezoelectric layer 327 and the main electrode layer 325, and, for example, Ti is preferably used as a material of the adhesion layer 324. The film thickness of the adhesion layer 324 is preferably, for example, about 12 nm.

For example, Al including 1% of Cu is preferably used as a material of the main electrode layer 325. The film thickness of the main electrode layer 325 is preferably, for example, about 162 nm.

A protection layer 326 covers the IDT electrode. The protection layer 326 protects the main electrode layer 325 from the external environment, adjusts the frequency temperature characteristics, and improves the moisture resistance, and is a film whose main component is preferably, for example, silicon dioxide. The film thickness of the protection layer 326 is preferably, for example, about 25 nm.

Note that the materials of the adhesion layer 324, the main electrode layer 325, and the protection layer 326 are not restricted to those described above. Furthermore, the IDT electrode need not have the above-described multilayer structure. The IDT electrode may be made of a metal or an alloy of metals, for example, Ti, Al, Cu, Pt, Au, Ag, and Pd, or may include a plurality of multilayer bodies made of the above-mentioned metals or alloys. In addition, the protection layer 326 may not be provided.

The above-described IDT electrode and reflectors 32c are provided on a main surface of a substrate 320 described next. Hereinafter, the multilayer structure of the substrate 320 will be described.

As shown in part (c) of FIG. 3A, the substrate 320 includes a high-acoustic-velocity supporting substrate 329, a low-acoustic-velocity film 328, and the piezoelectric layer 327, and has a structure in which the high-acoustic-velocity supporting substrate 329, the low-acoustic-velocity film 328, and the piezoelectric layer 327 are laminated in this order.

The piezoelectric layer 327 is preferably a piezoelectric film that includes a main surface on which the IDT electrode and the reflectors 32c are provided. The piezoelectric layer 327 is preferably made of, for example, a 50° Y-cut X-propagation LiTaO$_3$ piezoelectric single crystal or piezoelectric ceramics (lithium tantalate single crystal cut along a face that has, as a normal, an axis rotated by about 50° from the Y-axis around the X-axis defining the central axis or ceramics, which is single crystal or ceramics in which surface acoustic waves propagate in the X-axis direction). The thickness of the piezoelectric layer 327 is preferably, for example, less than or equal to 3.5λ where λ is the wavelength of elastic waves defined by the electrode pitch of the IDT electrode, and is preferably, for example, about 600 nm.

The high-acoustic-velocity supporting substrate 329 is a substrate that supports the low-acoustic-velocity film 328, the piezoelectric layer 327, and the IDT electrode. The high-acoustic-velocity supporting substrate 329 is a substrate where the acoustic velocity of bulk waves in the high-acoustic-velocity supporting substrate 329 is higher than that of elastic waves, for example, surface waves or boundary waves propagating through the piezoelectric layer 327, and confines surface acoustic waves in a portion where the piezoelectric layer 327 and the low-acoustic-velocity film 328 are laminated, thus preventing the surface acoustic waves from leaking downward below the high-acoustic-velocity supporting substrate 329. The high-acoustic-velocity supporting substrate 329 is preferably, for example, a silicon substrate, and has a thickness of about 125 μm, for example. Note that the high-acoustic-velocity supporting substrate 329 may be made of any of the following: (1) a piezoelectric body, for example, aluminum nitride, silicon carbide, silicon nitride, silicon, lithium tantalate, lithium niobate, or crystal; (2) various types of ceramics, for example, aluminum oxide(alumina), sapphire, zirconia, cordierite, mullite, steatite, and forsterite; (3) magnesia diamond; (4) a material mainly including the above materials; and (5) a material mainly including a mixture of the above materials.

The low-acoustic-velocity film 328 is a film where the acoustic velocity of bulk waves in the low-acoustic-velocity film 328 is lower than that of elastic waves propagating through the piezoelectric layer 327, and is provided between the piezoelectric layer 327 and the high-acoustic-velocity supporting substrate 329. With this structure and the characteristic that the energy of elastic waves is concentrated in a low-acoustic-velocity medium, leakage of the energy of surface acoustic waves to the outside of the IDT electrode is significantly reduced or prevented. The low-acoustic-velocity film 328 is preferably, for example, a film that includes silicon dioxide as a main component. The thickness of the low-acoustic-velocity film 328 is preferably, for example, less than or equal to 2λ where λ is the wavelength of elastic waves defined by the electrode pitch of the IDT electrode, and is preferably, for example, about 670 nm.

According to the above-described multilayer structure of the substrate 320, compared with a conventional structure that uses a single-layer piezoelectric substrate, the Q value at the resonant frequency and the anti-resonant frequency can be greatly increased. That is, because a SAW resonator with a high Q value can be provided, a filter with a low insertion loss can be provided using this SAW resonator.

Note that the high-acoustic-velocity supporting substrate 329 may have a structure in which a supporting substrate and a high-acoustic-velocity film are laminated, in which the acoustic velocity of bulk waves propagating through the high-acoustic-velocity film is higher than that of elastic waves, for example, surface waves or boundary waves propagating through the piezoelectric layer 327. In this case, the supporting substrate may be made of the following materials: a piezoelectric body, for example, lithium tantalate, lithium niobate, or crystal; various types of ceramics, for example, alumina, magnesia, silicon nitride, aluminum nitride, silicon carbide, zirconia, cordierite, mullite, steatite, and forsterite; a dielectric, for example, glass; semiconductor, for example, silicon, sapphire, and gallium nitride; resin substrate; or the like. In addition, the high-acoustic-velocity film may be made of various high-acoustic-velocity materials as follows: aluminum nitride, aluminum oxide, silicon carbide, silicon nitride, silicon oxynitride, DLC film, or diamond; a medium mainly including the above-mentioned materials; and a medium mainly including a mixture of the above-mentioned materials.

Figure 3B:
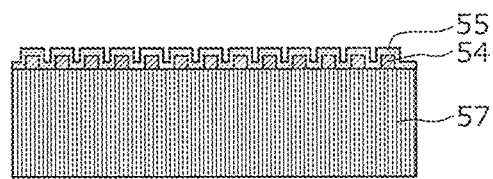
FIG. 3B is a sectional view representing another example of the resonator in the Band-25 reception-side filter.

FIG. 3B is a sectional view representing another example of the resonator in the Band-25 reception-side filter 12. Although the example in which the IDT electrode included in the resonator is provided on the piezoelectric substrate 320 with the piezoelectric layer 327 has been shown in the resonator shown in FIG. 3A, a substrate on which the IDT electrode is provided may be a piezoelectric substrate 57 including a single-layer piezoelectric layer, as shown in FIG. 3B. The piezoelectric substrate 57 is preferably made of, for example, $LiNbO_3$ piezoelectric single crystal.

In addition, a substrate on which an IDT electrode 54 is provided may have a structure in which a supporting substrate, an energy-confining layer, and a piezoelectric film are laminated in this order. The IDT electrode 54 is provided on the piezoelectric film. For example, $LiTaO_3$ piezoelectric single crystal or piezoelectric ceramics is preferably used for the piezoelectric film. The supporting substrate supports the piezoelectric film, the energy-confining layer, and the IDT electrode 54.

The energy-confining layer includes one or more layers, and the velocity of elastic bulk waves propagating through at least one of these layers is greater than the velocity of elastic waves propagating through the surroundings of the piezoelectric film. For example, the energy-confining layer may have a multilayer structure including a low-acoustic-velocity layer and a high-acoustic-velocity layer. The low-acoustic-velocity layer is a film in which the acoustic velocity of bulk waves in the low-acoustic-velocity layer is lower than the acoustic velocity of elastic waves propagating through the piezoelectric film. The high-acoustic-velocity layer is a film in which the acoustic velocity of bulk waves in the high-acoustic-velocity layer is higher than the acoustic velocity of elastic waves propagating through the piezoelectric film. Note that the supporting substrate may be a high-acoustic-velocity layer.

In addition, the energy-confining layer may be an acoustic impedance layer with a configuration in which a low-acoustic impedance layer in which the acoustic impedance is relatively low and a high-acoustic impedance layer in which the acoustic impedance is relatively high are alternately laminated.

In addition, although the piezoelectric layer 327 according to the above-described first preferred embodiment uses a 50° Y-cut X-propagation $LiTaO_3$ piezoelectric single crystal, the cut angle of a single crystal material is not restricted to this. The multilayer structure, materials, and thickness may be appropriately changed in accordance with predetermined bandpass characteristics for the elastic wave filter apparatus, and the same or similar advantageous effects are achieved by a SAW filter using a $LiTaO_3$ piezoelectric substrate or a $LiNbO_3$ piezoelectric substrate with a cut angle different from the above.

Here, exemplary electrode parameters (example) of the IDT electrode included in the SAW resonator will be described.

The wavelength of the SAW resonator is defined by the wavelength λ, which is a repetition period of the plurality of electrode fingers 322a or 322b included in the IDT electrode shown in part (b) of FIG. 3A. In addition, the electrode pitch is half of the wavelength λ, and is defined by (W+S) where W is the line width of the electrode fingers 322a and 322b included in the comb-shaped electrodes 32a and 32b and S is the space width between the adjacent electrode fingers 322a and 322b. In addition, the cross width L of the pair of comb-shaped electrodes 32a and 32b is, as shown in part (a) of FIG. 3A, the length of electrode fingers that overlap each other when viewed in the direction D of the electrode fingers 322a and 322b. In addition, the electrode duty of each resonator is the line width occupancy of the plurality of electrode fingers 322a and 322b, which is the line width ratio relative to the sum of the line width and the space width of the plurality of electrode fingers 322a and 322b, and which is defined by W/(W+S).

Table 1 indicates the details of the electrode parameters (wavelength λ, cross width L, number of pairs N, and electrode duty R) of the series arm resonator 101 and the parallel arm resonators 151 to 153 included in the reception-side filter 12 according to the example. In this configuration, the parallel arm resonator 151 has a greater capacitance than the parallel arm resonators 152 and 153, and accordingly, the parallel arm resonator 151 is a resonator with the lowest frequency among the parallel arm resonators 151 to 153.

TABLE 1

|  | SERIES ARM RESONATOR 101 | PARALLEL ARM RESONATOR 151 | PARALLEL ARM RESONATOR 152 | PARALLEL ARM RESONATOR 153 |
|---|---|---|---|---|
| WAVELENGTH λ (μm) | 1.9228 | 2.0207 | 1.9937 | 1.9810 |
| CROSS WIDTH L (μm) | 15.1 | 33.2 | 16.1 | 14.7 |
| NUMBER OF PAIRS N | 80 | 242 | 160 | 118 |
| ELECTRODE DUTY R | 0.5 | 0.5 | 0.5 | 0.5 |

In addition, Table 2 indicates the details of the electrode parameters (wavelength λ, cross width L, number of pairs N, and electrode duty R) of the IDTs 103a to 103e of the longitudinally-coupled filter portions 103 included in the reception-side filter 12 according to the example. Note that the IDTs 103a to 103e have a main pitch area with a wavelength λ1 and a narrow pitch area with a wavelength λ2 less than λ1. The distance between each of the IDTs 103a and 103e and a reflector closest to each of the IDTs 103a and 103e is 0.53 λR.

TABLE 2

|  | IDT 103a | IDT 103b | IDT 103c | IDT 103d | IDT 103e |
|---|---|---|---|---|---|
| MAIN PITCH WAVELENGTH λ1 (μm) | 1.9876 | 1.9391 | 1.9694 | 1.9391 | 1.9876 |
| NARROW PITCH | 1.7704 | 1.8334 (103a | 1.8971 | 1.8334 (103e | 1.7704 |

TABLE 2-continued

|  | IDT 103a | IDT 103b | IDT 103c | IDT 103d | IDT 103e |
|---|---|---|---|---|---|
| WAVELENGTH $\lambda 2$ (µm) |  | SIDE) 1.876 (103c SIDE) |  | SIDE) 1.876 (103c SIDE) |  |
| MAIN PITCH NUMBER OF PAIRS N1 | 20.5 | 12.5 | 17.0 | 12.5 | 20.5 |
| NARROW PITCH NUMBER OF PAIRS N2 | 1.5 | 1.0 (103a SIDE) 3.5 (103c SIDE) | 4.0 | 1.0 (103e SIDE) 3.5 (103c SIDE) | 1.5 |
| ELECTRODE DUTY R | 0.5 | 0.5 | 0.5 | 0.5 | 0.5 |

Although all of the series arm resonator and the parallel arm resonators in the reception-side filter 12 include slanted IDTs in the above-described example, it is sufficient if, among resonators included in the reception-side filter 12, at least the parallel arm resonators 151 to 153 include slanted IDTs. In addition, IDTs are not restricted to slanted IDTs, and may be other apodization-weighting IDTs.

Although all of the series arm resonator and the parallel arm resonators include offset electrode fingers in the above-described example, alternatively, each resonator may not include offset electrode fingers.

In addition, each of IDTs included in the series arm resonator, the parallel arm resonators, and the longitudinally-coupled filter portion included in the transmission-side filters 11 and 13 and the reception-side filter 14 may be a slanted IDT, another apodization-weighting IDT, or an IDT in which the cross width is not weighted.

4. Resonator Structure Different Between Example and Comparative Example

Here, in the reception-side filter 12 according to an example of the first preferred embodiment, the point that the parallel arm resonator 151 and the other parallel arm resonators 152 and 153 have different resonator structures will be described. In addition, the features of the reception-side filter 12 of a multiplexer according to a later-described comparative example will be described in comparison with the multiplexer 1.

Note that each of IDTs included in the series arm resonator 101 and the longitudinally-coupled filter portions 103 may be a slanted IDT, an apodization-weighting IDT, or an IDT in which the cross width is not weighted, as described above. Hereinafter, the series arm resonator 101 will be described as having the same or substantially the same features as the parallel arm resonators 152 and 153, along with the parallel arm resonators 152 and 153.

Figure 4:
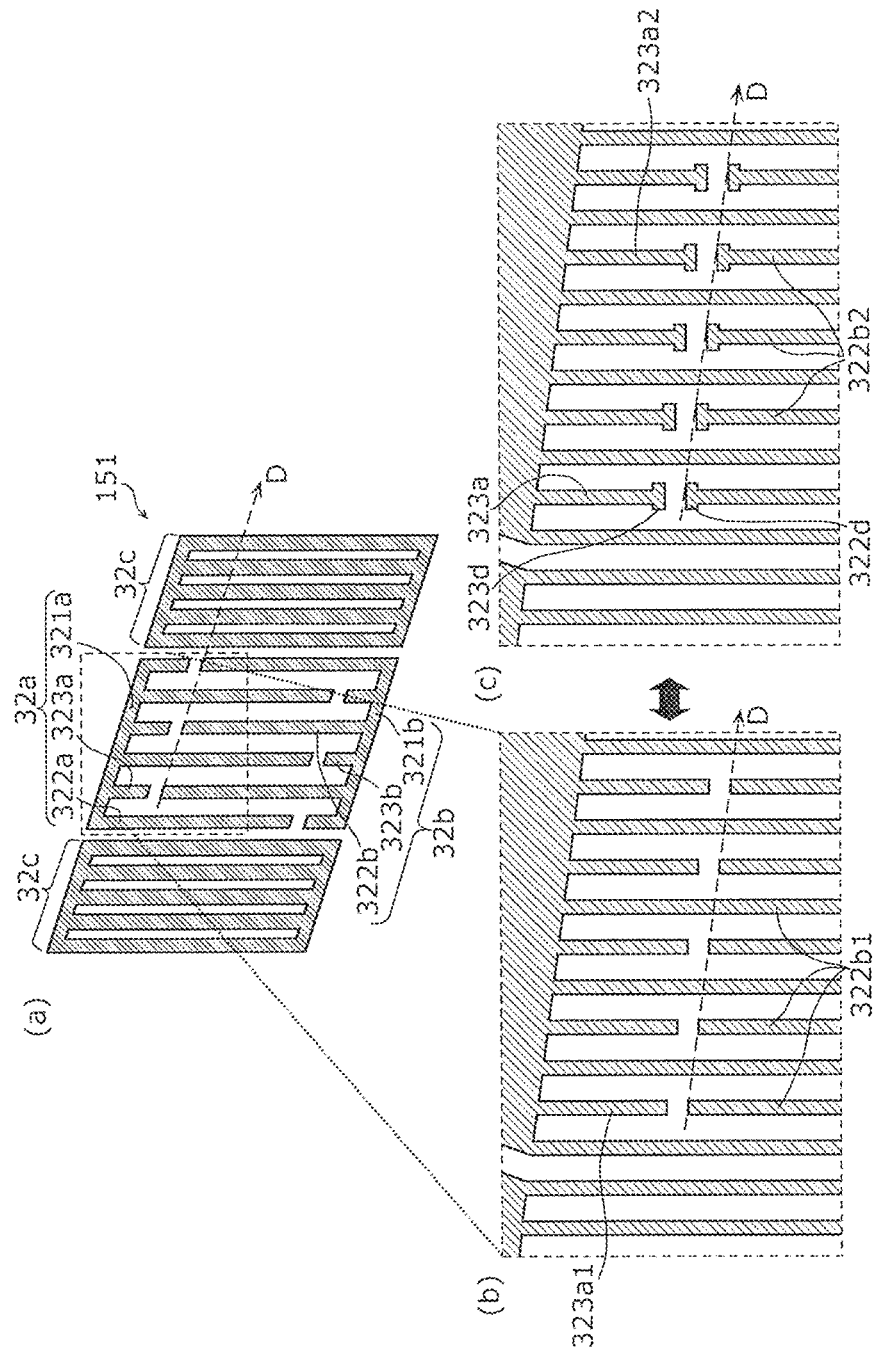
FIG. 4 includes plan views of the IDT electrode in the Band-25 reception-side filter according to the first preferred embodiment of the present invention.

FIG. 4 includes plan views of the IDT electrode in the Band-25 reception-side filter 12 according to the first preferred embodiment. Part (a) of FIG. 4 is a view showing the overall structure of the IDT electrode, part (b) of FIG. 4 is an enlarged view of a portion of the IDT electrode of the parallel arm resonator 151, and part (c) of FIG. 4 is an enlarged view of a portion of the IDT electrode of the series arm resonator 101 and the parallel arm resonators 152 and 153.

As shown in parts (a) to (c) of FIG. 4, in the reception-side filter 12 according to the present example, the parallel arm resonators 152 and 153 and the series arm resonator 101 include slanted IDTs, and the electrode fingers 322a and 322b included in the pair of comb-shaped electrodes 32a and 32b (322b2) having end portions 322d shown in part (c) of FIG. 4) and the offset electrode fingers 323a (323a2 having end portions 323d shown in part (c) of FIG. 4) and 323b are third electrode fingers. In short, the pluralities of electrode fingers 322a and 322b and the offset electrode fingers 323a and 323b included in the parallel arm resonators 152 and 153 and the series arm resonator 101 include electrode finger widths at end portions that are wider than electrode finger widths at center portions thereof.

Here, among the plurality of electrode fingers, electrode fingers having a shape in which the electrode finger width at end portions not connected to the busbar electrode is wider than the electrode finger width at the center portion of the electrode fingers are defined as variant fingers.

In contrast, the parallel arm resonator 151 also includes a slanted IDT. The electrode fingers 322a and 322b (322b1 shown in part (b) of FIG. 4) and the offset electrode fingers 323a (323a1 shown in part (b) of FIG. 4) and 323b included in the pair of comb-shaped electrodes 32a and 32b are fourth electrode fingers. In short, the pluralities of electrode fingers 322a and 322b and the offset electrode fingers 323a and 323b included in the parallel arm resonator 151 include electrode finger widths at end portions that are less than or equal to electrode finger widths at center portions thereof, and they are not variant fingers.

In addition, the reception-side filter 12 of the multiplexer according to the comparative example includes, similar to the reception-side filter 12 of the multiplexer 1 according to the present example, the series arm resonator 101, the parallel arm resonators 151 to 153, and the longitudinally-coupled filter portion including the two longitudinally-coupled filter portions 103 electrically connected in parallel with each other, between the reception input terminal 62 and the reception output terminal 20. In the reception-side filter 12 of the multiplexer according to the comparative example, the electrode parameters of the series arm resonator 101, the parallel arm resonators 151 to 153, and the IDTs 103a to 103e of the longitudinally-coupled filter portions 103 are the same or substantially the same as the electrode parameters of the series arm resonator 101, the parallel arm resonators 151 to 153, and the IDTs 103a to 103e of the longitudinally-coupled filter portions 103, which are indicated in Table 1 and Table 2.

The reception-side filter 12 according to the comparative example is different from the reception-side filter 12 according to the first preferred embodiment in the point that, in the parallel arm resonator 151, the electrode fingers 322a and 322b and the offset electrode fingers 323a and 323b included in the pair of comb-shaped electrodes 32a and 32b are third electrode fingers (variant fingers) in which the electrode finger width at end portions is wider than the electrode finger width at the center portion.

In short, in the reception-side filter 12 according to the present example, electrode fingers of the parallel arm resonator 151 closest to the common connection terminal 50 include fourth electrode fingers, and do not include third electrode fingers (variant fingers). In addition, electrode fingers of the parallel arm resonators 152 and 153 include third electrode fingers (variant fingers). In addition, electrode fingers of the series arm resonator 101 include third electrode fingers (variant fingers).

In contrast, in the reception-side filter 12 according to the comparative example, electrode fingers of the series arm resonator 101 and the parallel arm resonators 151 to 153 include third electrode fingers (variant fingers).

Note that, in the reception-side filter 12 according to the first preferred embodiment, electrode fingers of the parallel arm resonator 151 are not restricted to a configuration without third electrode fingers (variant fingers), and may be a configuration with third electrode fingers. At this time, it is sufficient if the ratio of the number of fourth electrode fingers out of the electrode fingers of the parallel arm resonator 151 is higher than the ratio of the number of fourth electrode fingers out of the electrode fingers of the parallel arm resonators 152 and 153. In addition, the ratio of the number of third electrode fingers out of the electrode fingers of the parallel arm resonator 151 may be lower than the ratio of the number of third electrode fingers out of the electrode fingers of the parallel arm resonators 152 and 153.

Hereinafter, advantageous effects achieved by the multiplexer 1 according to the present example will be described in comparison with the multiplexer according to the comparative example.

Figure 5A:
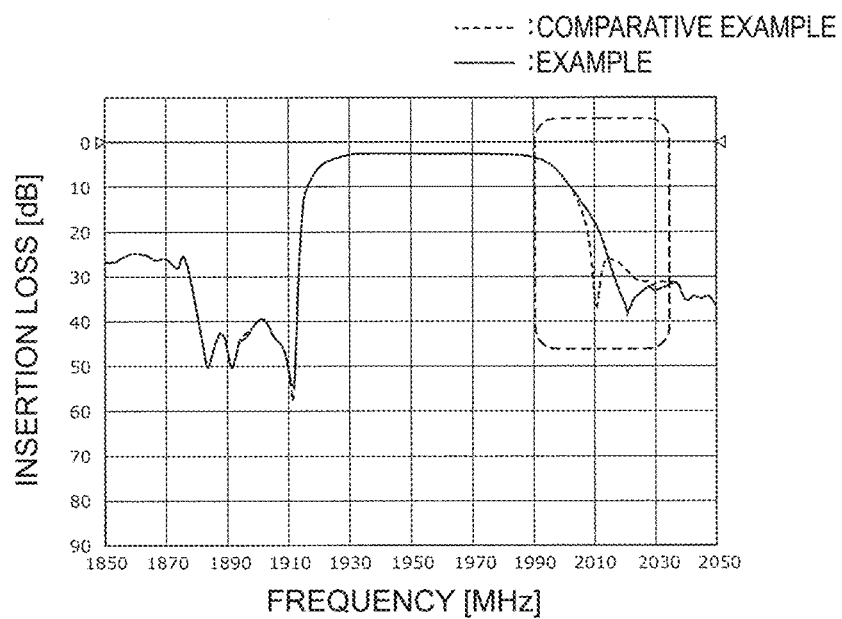
FIG. 5A is a graph showing the transmission characteristics of the Band-25 reception-side filter in the multiplexer according to the first preferred embodiment of the present invention.
Figure 5B:
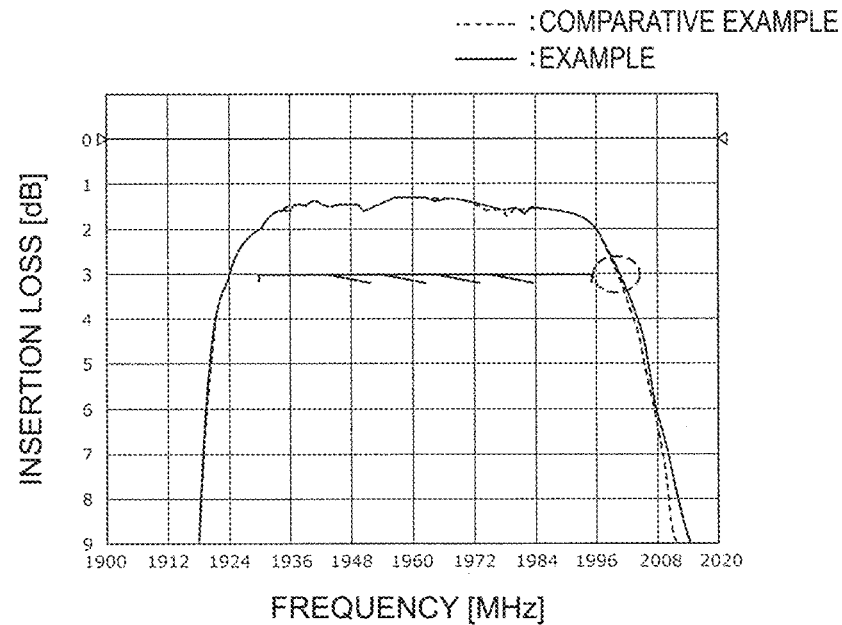
FIG. 5B is an enlarged graph of a portion of FIG. 5A.

5. Comparison of Characteristics of Multiplexers According to Example and Comparative Example FIG. 5A is a graph showing the transmission characteristics of the Band-25 reception-side filter in the multiplexer 1 according to the first preferred embodiment. FIG. 5B is an enlarged graph of a portion of FIG. 5A.

FIGS. 5A and 5B show transmission characteristics measured by extracting only the reception-side filter 12 from the features of the multiplexer 1 according to the present example. In addition, FIGS. 5A and 5B show the transmission characteristics of the reception-side filter 12 in the case where variant fingers are provided in the parallel arm resonator 151, as described above, which is the comparative example. Specifically, FIGS. 5A and 5B show the bandpass characteristics of a path that goes through the reception-side filter 12, and more specifically show the ratio of the intensity of a signal output from the reception output terminal 20 relative to the intensity of a signal input to the reception input terminal 62.

As indicated in an area surrounded by a broken line in FIG. 5A, in the reception-side filter 12 according to the present example, an attenuation pole generated on the higher frequency side of the passband is shifted to higher frequencies, compared with the case of the reception-side filter 12 according to the comparative example. Accordingly, the bandwidth of the passband of the reception-side filter 12 according to the present example is broader by about 1 MHz in the case where the insertion loss is about 3 dB, as shown in FIG. 5B. Note that the electric characteristics other than this, particularly the steepness on the lower frequency side of the passband, are almost identical in the reception-side filter 12 according to the example and the reception-side filter 12 according to the comparative example.

When the bandwidth of the passband becomes broader, the tolerance for variations in characteristics due to temperature and processing variations becomes broader. Therefore, according to the reception-side filter 12 according to the present example, the yield rate of the multiplexer 1 is able to be significantly improved, and the insertion loss can be reduced.

Figure 6A:
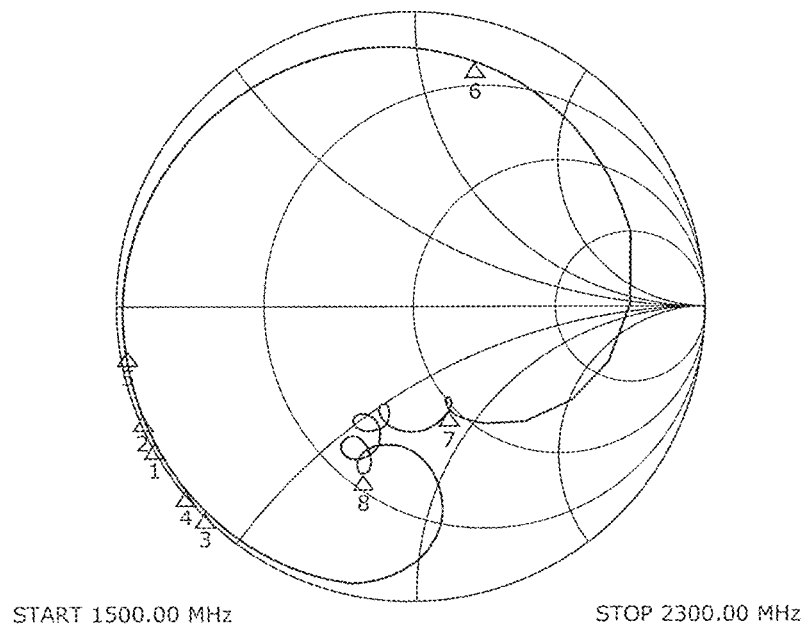
FIG. 6A is a Smith chart showing impedance characteristics before an inductance element is electrically connected in the Band-25 reception-side filter in the multiplexer according to the first preferred embodiment of the present invention.
Figure 6B:
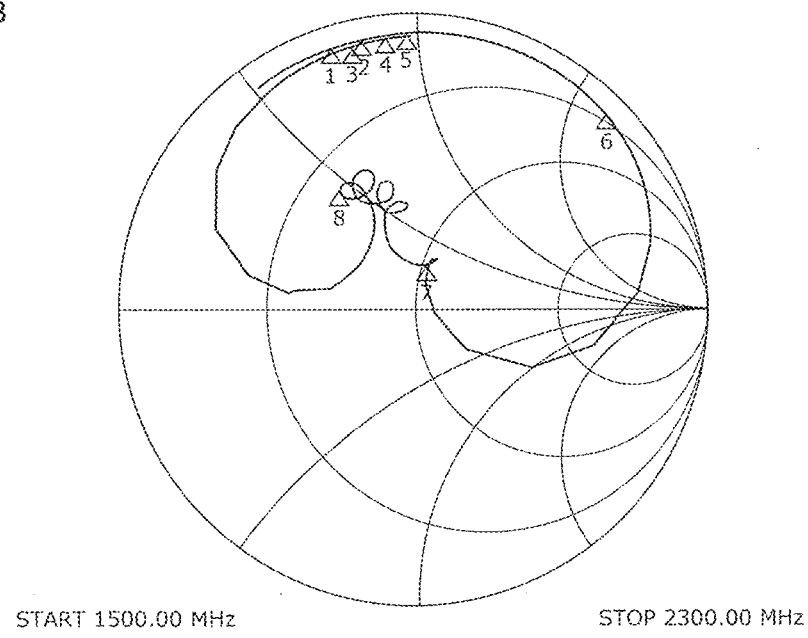
FIG. 6B is a Smith chart showing impedance characteristics after an inductance element is electrically connected in the Band-25 reception-side filter in the multiplexer according to the first preferred embodiment of the present invention.

This is because of the following reason. FIG. 6A is a Smith chart showing impedance characteristics before the inductance element 21 is electrically connected in the Band-25 reception-side filter 12 in the multiplexer 1 according to the first preferred embodiment. FIG. 6B is a Smith chart showing impedance characteristics after the inductance element 21 is electrically connected in the Band-25 reception-side filter 12 in the multiplexer 1 according to the first preferred embodiment. Note that markers 1 and 2 shown in FIGS. 6A and 6B indicate the passband of the transmission-side filter 13; markers 3 and 4 indicate the passband of the transmission-side filter 11; markers 5 and 6 indicate the passband of the reception-side filter 14; and markers 7 and 8 indicate the passband of the reception-side filter 12.

As described above, in the case of matching impedance between the antenna connection terminal 60 and the common connection terminal 50 of the multiplexer 1 in a state in which the inductance element 21 is electrically connected in series between the reception-side filter 12 and the common connection terminal 50, the impedance in the passbands of the transmission-side filters 11 and 13 and the reception-side filters 12 and 14 electrically connected to the common connection terminal 50 is preferably moved, for example, from the impedance shown in FIG. 6A to the inductive side, as in the impedance shown in FIG. 6B. Here, in order to set the value of the inductance element 21 as small as possible, in the multiplexer 1 before the inductance element 21 is electrically connected, the impedance in the passbands of the transmission-side filters 11 and 13 and the reception-side filters 12 and 14 is preferably provided near short (the left end of the Smith chart) as close as possible, as shown in FIG. 6A, for example.

In order to arrange the impedance in the passbands of the transmission-side filters 11 and 13 and the reception-side filters 12 and 14 near short (the left end of the Smith chart) as close as possible, the capacitance of the parallel arm resonator 151, which is closest to the common connection terminal 50 of the reception-side filter 12, is preferably greater than the capacitances of the parallel arm resonators 152 and 153, for example.

Here, although a parallel arm resonator is generally used to significantly improve the steepness on the lower frequency side of the passband, the resonance point of a parallel arm resonator is preferably provided at a frequency that is close to or in the passband in order to significantly improve the steepness on the lower frequency side of the passband, for example. However, if the resonance point of the parallel arm resonator 151 with a great capacitance is at a frequency close to the passband, the loss is deteriorated.

Figure 7:
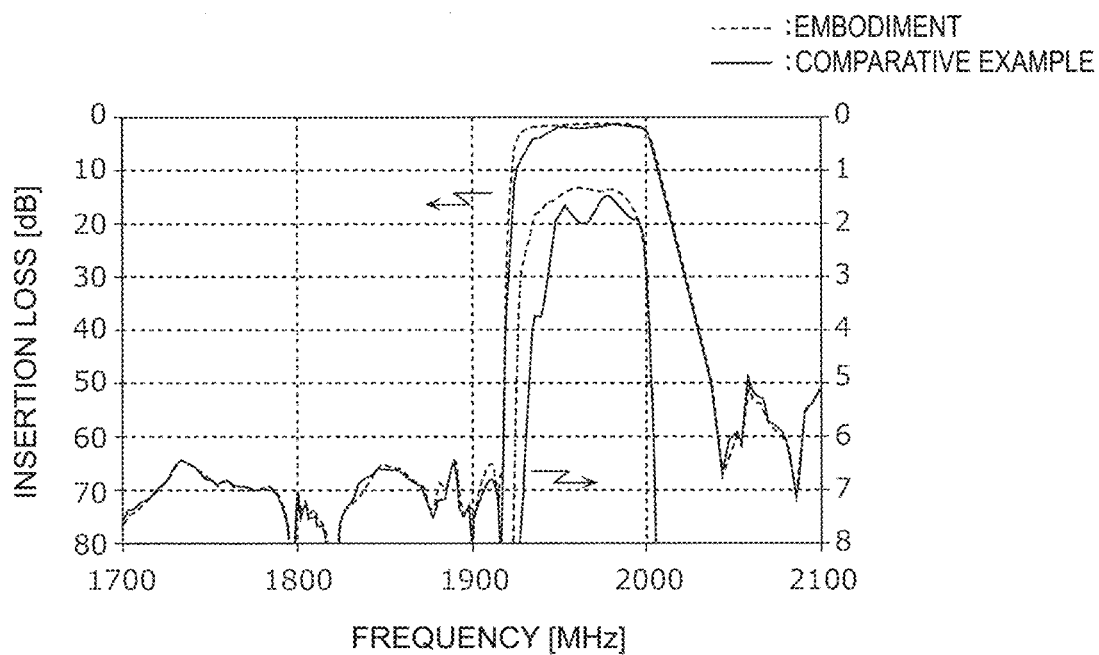
FIG. 7 is a graph comparing the bandpass characteristics of the Band-25 reception-side filter according to the first preferred embodiment of the present invention and a comparative example.

FIG. 7 is a graph comparing the bandpass characteristics of the Band-25 reception-side filter 12 according to the first preferred embodiment and the comparative example. In FIG. 7, the waveform of the comparative example (solid line) represents, in comparison with the waveform of the first preferred embodiment (broken line), characteristics in the case where the wavelength of the parallel arm resonator 151, which is arranged at a position closest to the common connection terminal 50, is reduced by about 0.02 μm, and the resonance point is closer to a frequency near the passband.

As shown in FIG. 7, in the case where the resonance point of the parallel arm resonator 151 is closer to a frequency near the passband, it is clear that the loss is greatly deteriorated on the lower frequency side of the passband.

Therefore, in order to significantly reduce or prevent deterioration of the loss on the lower frequency side of the passband, the frequency of the resonance point of the parallel arm resonator 151 is preferably lower than the frequency of the resonance point of each of the parallel arm resonators 152 and 153, for example.

Figure 8:
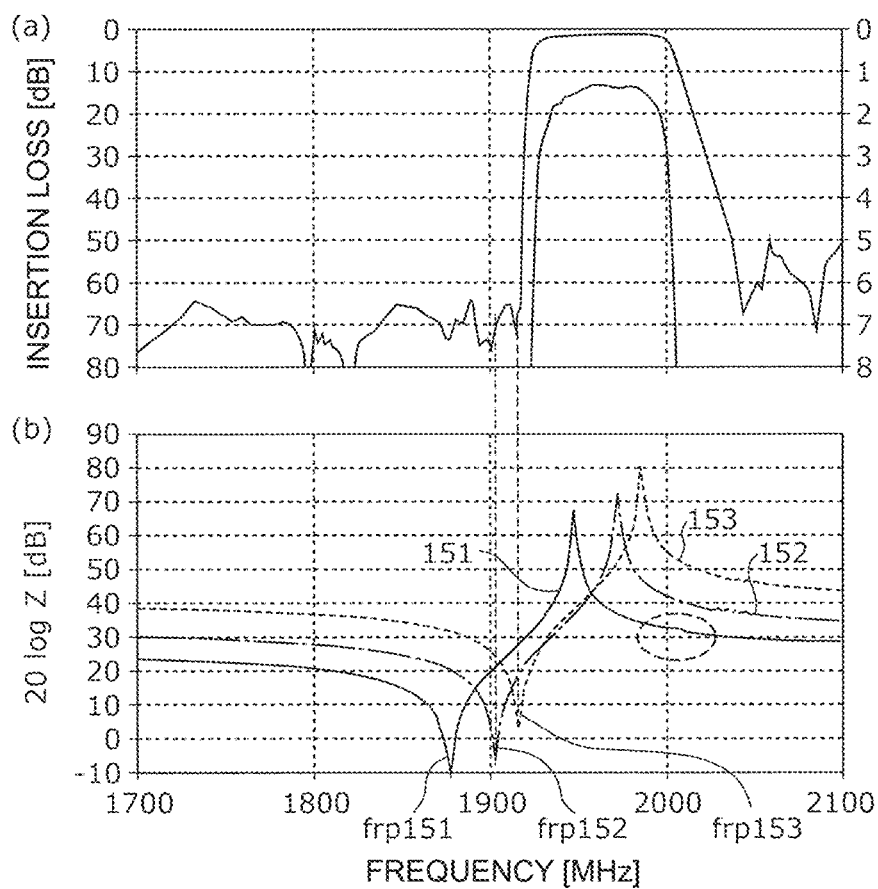
FIG. 8 includes graphs showing, in comparison with the comparative example, the resonance characteristics of a parallel arm resonator closest to the common connection terminal in the Band-25 reception-side filter according to the first preferred embodiment of the present invention.

FIG. 8 includes graphs comparing the resonance characteristics of the parallel arm resonators 151, 152, and 153 in the Band-25 reception-side filter 12 according to the first preferred embodiment. In FIG. 8, part (a) shows the insertion loss of the reception-side filter 12, and part (b) shows the frequency characteristics of the impedance (impedance characteristics) of the parallel arm resonators 151, 152, and 153.

As shown in part (b) of FIG. 8, by setting a resonance frequency frp 151 of the parallel arm resonator 151 lower than a resonance frequency frp 152 of the parallel arm resonator 152 and a resonance frequency frp 153 of the parallel arm resonator 153, as shown in part (a) of FIG. 8, deterioration of the loss on the lower frequency side of the passband of the reception-side filter 12 can be significantly reduced or prevented.

In contrast, as its adverse effects, as shown in part (b) of FIG. 8, stopband ripples are generated on the higher frequency side of the passband of the parallel arm resonator 151 (broken-line circular area). Stopband ripples are a rippled impedance disturbance that occurs due to reflectors of the resonator, in a stopband other than the passband, such as at frequencies higher than the anti-resonance point of the resonator. Accordingly, there is a problem that the bandwidth of the passband on the higher frequency side of the reception-side filter 12 becomes narrower.

More specifically, in the parallel arm resonator 151, the reflectors 32c are designed to have a high reflection coefficient in a certain band including the resonant frequency of the resonator in order to confine the propagated surface acoustic waves without leaking them to the outside.

At this time, due to the reflectors 32c, bouncing back of the reflection coefficient, which is the reflection coefficient repeatedly becoming higher and lower, occurs in a peripheral band of a certain band where the reflection coefficient is high.

In a SAW resonator, due to this bouncing back of the reflection coefficient, as shown by the broken-line circle in part (b) of FIG. 8, ripples occur in the impedance characteristics at frequencies higher than the anti-resonance point (that is, at frequencies higher than either of a resonant frequency fr and an anti-resonant frequency fa).

In general, a filter with a ladder filter structure defines a bandpass filter that has a resonant frequency frs of a series arm resonator and an anti-resonant frequency fap of a parallel arm resonator as the center frequency of the passband by substantially matching frs and fap. If a SAW resonator is used as a parallel arm resonator in a ladder filter structure, stopband ripples are caused by the above-mentioned reflectors 32c on the higher frequency side of the bandpass filter.

Specifically, as discussed as the comparative example in the first preferred embodiment, if electrode fingers included in the IDT electrode of the parallel arm resonator 151 of the reception-side filter 12 are third electrode fingers (variant fingers) like electrode fingers included in the IDT electrodes of the series arm resonator 101 and the parallel arm resonators 152 and 153, ripples are generated on the higher frequency side of the reception-side filter 12.

In contrast, with the features according to the present example, electrode fingers included in the IDT electrode of the parallel arm resonator 151 of the reception-side filter 12 are fourth electrode fingers (no variant fingers), unlike electrode fingers of the IDT electrodes of the parallel arm resonators 152 and 153. Accordingly, stopband ripples generated on the higher frequency side of the reception-side filter 12 are further shifted to higher frequencies, thus reducing the level of stopband ripples. This point will be described using FIGS. 9A and 9B.

Figure 9A:
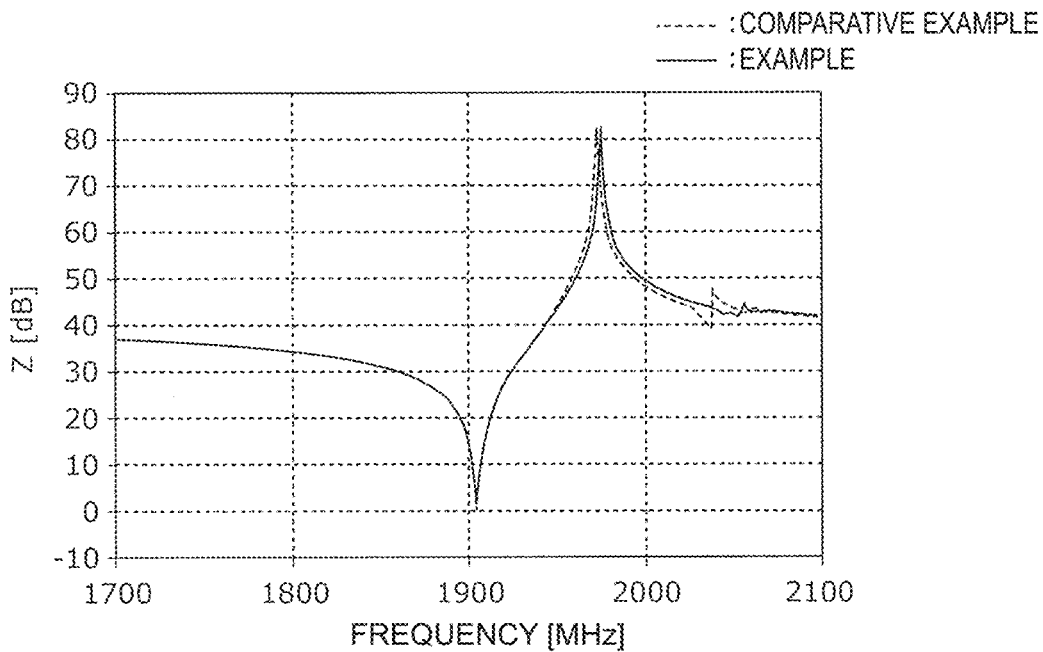
FIG. 9A is a graph showing, in comparison with the comparative example, the resonance characteristics of a parallel arm resonator closest to the common connection terminal in the Band-25 reception-side filter according to the first preferred embodiment of the present invention.
Figure 9B:
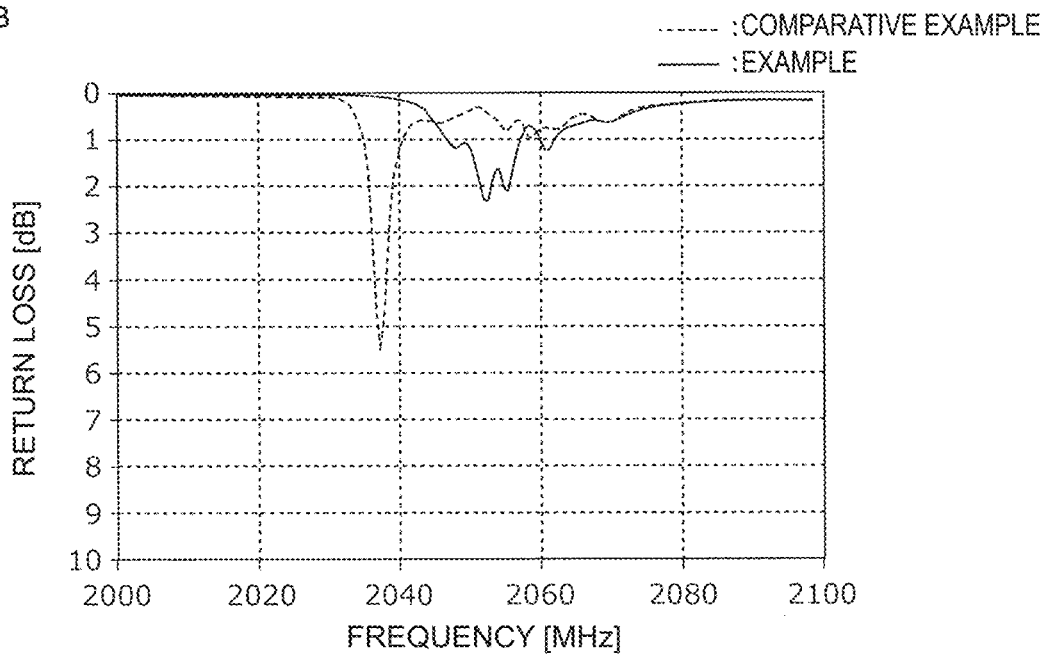
FIG. 9B is a graph showing, in comparison with the comparative example, the reflection characteristics of a parallel arm resonator closest to the common connection terminal in the Band-25 reception-side filter according to the first preferred embodiment of the present invention.

FIG. 9A is a graph showing, in comparison with the comparative example, the resonance characteristics of the parallel arm resonator 151 closest to the common connection terminal 50 of the Band-25 reception-side filter 12 according to the first preferred embodiment. FIG. 9B is a graph showing, in comparison with the comparative example, the reflection characteristics of the parallel arm resonator 151 closest to the common connection terminal 50 of the Band-25 reception-side filter 12 according to the first preferred embodiment. Specifically, FIG. 9A shows the resonance characteristics (broken line) of the parallel arm resonator 151 according to the comparative example, which includes third electrode fingers (variant fingers), and the resonance characteristics (solid line) of the parallel arm resonator 151 according to the example, which includes fourth electrode fingers (no variant fingers). In addition, FIG. 9B shows the reflection characteristics (broken line) of the parallel arm resonator 151 according to the comparative example, which includes third electrode fingers (variant fingers), and the reflection characteristics (solid line) of the parallel arm resonator 151 according to the example, which includes fourth electrode fingers (no variant fingers). The reflection characteristics indicate a return loss which is the intensity ratio of a signal output to the common connection terminal 50 relative to the intensity of a signal input from the common connection terminal 50 to the reception-side filter 12.

In the case where the parallel arm resonator 151 includes a structure of a slanted IDT on a substrate with a multilayer structure including a piezoelectric layer 327, a low-acoustic-velocity film 328, and the high-acoustic-velocity supporting substrate 329, as discussed as the comparative example, according to the IDT electrode including third electrode fingers (variant fingers), as shown in FIG. 9A, the Q characteristic of the resonator significantly improves. However, at frequencies higher than the anti-resonance point, stopband ripples are greatly generated.

In contrast, as described as the example, in the case where the IDT electrode of the parallel arm resonator 151 includes only fourth electrode fingers (no variant fingers) without including third electrode fingers (variant fingers), as shown in FIG. 9A, although the resonance characteristics deteriorate, as shown in FIG. 9B, stopband ripples are shifted further to the higher frequency side. Note that this deterioration of the resonance characteristics does not affect the characteristics of the reception-side filter 12, particularly the steepness on the lower frequency side of the passband, since the frequency of the resonance point of the parallel arm resonator 151 is set to be lower than the frequency of the resonance point of each of the other parallel arm resonators 152 and 153. In addition, the level of the ripples becomes smaller, and the return loss decreases. Accordingly, the passband of the reception-side filter 12 according to the example becomes broader than the comparative example. In addition, because the stopband ripples are generated in a stopband on the higher frequency side of the reception-side filter 12, the passband of the reception-side filter 12 is not affected.

Accordingly, in the multiplexer 1 according to the present example, the ratio of the number of variant fingers of the parallel arm resonator 151 is set to be lower than the parallel arm resonators 152 and 153. Accordingly, stopband ripples of the reception-side filter 12 can be shifted to higher frequencies and can be made smaller. Thus, the narrowing of the bandwidth of the passband of the reception-side filter 12 on the lower frequency side can be significantly reduced or prevented.

Note that the multiplexers according to preferred embodiments of the present invention are not restricted to the above-described features. For example, in the reception-side filter 12 according to the above-described example, the ratio of the number of fourth electrode fingers of electrode fingers included in the parallel arm resonator 151 closest to the common connection terminal 50 may be higher than the ratio of the number of fourth electrode fingers out of electrode fingers included in the other parallel arm resonators 152 and 153.

Accordingly, compared with the case in which all of the parallel arm resonators 151 to 153 included in the reception-side filter 12 have an equivalent ratio for the number of variant fingers, ripples generated on the higher frequency side of the passband of the reception-side filter 12 can be significantly reduced or prevented. Accordingly, the narrowing of the bandwidth of the passband of the reception-side filter 12 can be significantly reduced or prevented.

Furthermore, as described above, in the reception-side filter 12 according to the example, the number of third electrode fingers (variant fingers) of the IDT electrode included in the parallel arm resonator 151 closest to the common connection terminal 50 may be less than the number of third electrode fingers (variant fingers) of each of the IDT electrodes of the other parallel arm resonators 152 and 153.

Accordingly, even in the case where each IDT electrode included in each parallel arm resonator has different electrode parameters such as the number of pairs and the cross width, ripples in the passband of the reception-side filter 14 can be effectively reduced or prevented.

Modification

The multiplexers according to preferred embodiments of the present invention are not restricted to including, as discussed in the above-described first preferred embodiment, the inductance element 31 electrically connected between a connection path between the common connection terminal 50 and the antenna connection terminal 60 and a reference terminal.

Figure 10:
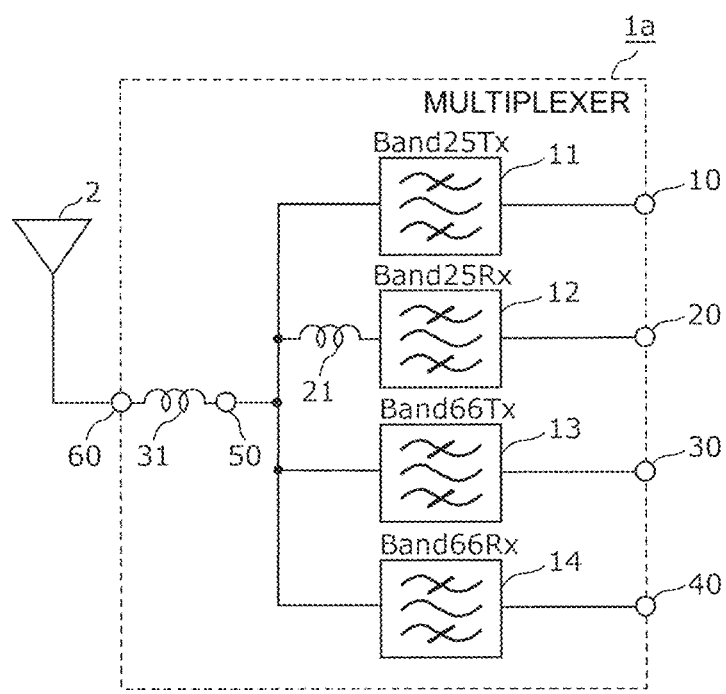
FIG. 10 is a circuit diagram of a multiplexer according to a modification of the first preferred embodiment of the present invention.

FIG. 10 is a circuit diagram of a multiplexer 1a according to a modification of the first preferred embodiment of the present invention. The multiplexer 1a according to the present modification includes, as shown in FIG. 10, for example, the inductance element 31 electrically connected in series to a connection path between the common connection terminal 50 and the antenna connection terminal 60.

Even with the above features, as described above, by setting the stopband ripples of the reception-side filter 12 smaller, ripples in the passband of the reception-side filter 14 on the higher frequency side can be significantly reduced or prevented without deteriorating the filter characteristics of the reception-side filter 12 on the lower frequency side.

Note that the features are not restricted to one inductance element electrically connected between the common connection terminal 50 and the antenna connection terminal 60, and may include a plurality of inductance elements that are electrically connected. In addition, the features are not restricted to an inductance element being electrically connected, but may include a capacitance element being electrically connected. In addition, an inductance element and a capacitance element may be electrically connected in series between the common connection terminal 50 and the antenna connection terminal 60, or may be electrically connected between a connection path between the common connection terminal 50 and the antenna connection terminal 60 and a reference terminal.

Second Preferred Embodiment

The multiplexer according to the above-described first preferred embodiment and its modification is applicable to an RF front-end circuit and further to a communication apparatus including the RF front-end circuit. Here, in a second preferred embodiment of the present invention, such an RF front-end circuit and a communication apparatus will be described.

Figure 11:
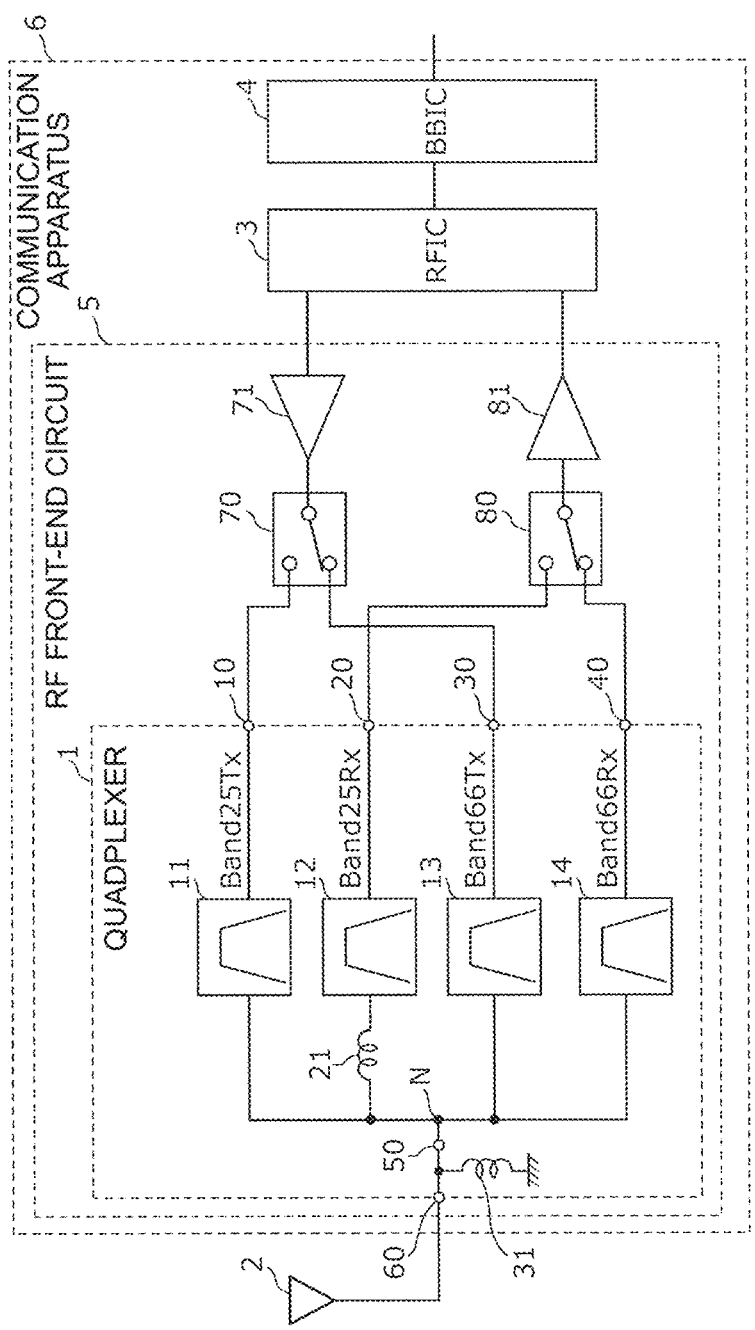
FIG. 11 is a circuit diagram of an RF front-end circuit according to a second preferred embodiment of the present invention.

FIG. 11 is a diagram showing an RF front-end circuit 5 according to a second preferred embodiment of the present invention. Note that elements electrically connected to the RF front-end circuit 5 (the antenna element 2, an RF signal processing circuit (RFIC) 3, and a baseband signal processing circuit (BBIC) 4) are additionally shown in the diagram. The RF front-end circuit 5, the RF signal processing circuit 3, and the baseband signal processing circuit 4 define a communication apparatus 6.

The RF front-end circuit 5 includes the multiplexer 1 according to the first preferred embodiment, a reception-side switch 80, a transmission-side switch 70, a low-noise amplifier circuit 81, and a power-amplifier circuit 71.

The transmission-side switch 70 is a switch circuit that includes two selection terminals respectively electrically connected to the transmission input terminals 10 and 30 of the multiplexer 1, and a common terminal electrically connected to the power-amplifier circuit 71.

The reception-side switch 80 is a switch circuit that includes two selection terminals respectively electrically connected to the reception output terminals 20 and 40 of the multiplexer 1, and a common terminal electrically connected to the low-noise amplifier circuit 81.

The transmission-side switch 70 and the reception-side switch 80 each include a switch of, for example, the SPDT (Single Pole Double Throw) type, which electrically connects the common terminal and a signal path corresponding to a certain band in accordance with a control signal from a controller (not shown). Note that the number of selection terminals electrically connected to the common terminal is not restricted to one, and may be plural. In short, the RF front-end circuit 5 may handle carrier aggregation.

The power-amplifier circuit 71 is a transmission amplifier circuit that amplifies an RF signal (here, an RF transmission signal) output from the RF signal processing circuit 3, and outputs the amplified signal to the antenna element 2 via the transmission-side switch 70 and the multiplexer 1.

The low-noise amplifier circuit 81 is a reception amplifier circuit that amplifies an RF signal (here, an RF reception signal) having gone through the antenna element 2, the multiplexer 1, and the reception-side switch 80, and outputs the amplified signal to the RF signal processing circuit 3.

The RF signal processing circuit 3 performs signal processing on an RF reception signal input from the antenna element 2 via a reception signal path by, for example, down-converting the RF reception signal, and outputs a reception signal generated by the signal processing to the baseband signal processing circuit 4. In addition, the RF signal processing circuit 3 performs signal processing on a transmission signal input from the baseband signal processing circuit 4 by, for example, up-converting the transmission signal, and outputs an RF transmission signal generated by the signal processing to the power-amplifier circuit 71. The RF signal processing circuit 3 is preferably, for example, an RFIC.

A signal processed by the baseband signal processing circuit 4 is used as, for example, an image signal for displaying an image, or an audio signal for conversation.

Note that the RF front-end circuit 5 may include another circuit element between the above-described elements.

According to the RF front-end circuit 5 and the communication apparatus 6 including the above features, ripples in the passband can be significantly reduced or prevented by including the multiplexer 1 according to the above-described first preferred embodiment.

Note that the RF front-end circuit 5 may include, instead of the multiplexer 1 according to the first preferred embodiment, a multiplexer 1a according to the modification of the first preferred embodiment.

In addition, the communication apparatus 6 may not include the baseband signal processing circuit (BBIC) 4 according to the RF signal processing method.

Although the multiplexers according to preferred embodiments of the present invention have been described as above by describing a preferred embodiment of a quadplexer, the present invention is not restricted to the above-described preferred embodiment. For example, the present invention may include preferred embodiments provided by including the following modifications to the above-described preferred embodiment.

For example, although the above description describes a quadplexer as a multiplexer by way of example, the present invention is also applicable to, for example, a triplexer including three filters having a common antenna connection terminal, or a hexaplexer including six filters having a common antenna connection terminal. In short, it is sufficient if the multiplexer includes two or more filters.

In addition, the multiplexer is not restricted to including both a transmission-side filter and a reception-side filter, and may have a configuration that only includes a transmission-side filter or only includes a reception-side filter.

In addition, it has been described in the above-described first preferred embodiment that the reception-side filter 12 corresponds to the first filter. In other words, the first filter is a reception filter in the first preferred embodiment. However, the present invention is applicable without being restricted to the application or the like of the first filter. Therefore, the first filter may be a transmission-side filter.

Preferred embodiments of the present invention can be widely used, for example, as a multiplexer, a front-end circuit, and a communication apparatus applicable to a multiband system in communication devices such as cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common connection terminal, a first terminal, and a second terminal;
a first filter on a first path electrically connecting the common connection terminal and the first terminal; and
a second filter on a second path electrically connecting the common connection terminal and the second terminal, wherein
the first filter includes:
one or more series arm resonators on the first path; and
two or more parallel arm resonators on a path electrically connecting the first path and ground;
each of the one or more series arm resonators and the two or more parallel arm resonators includes an IDT electrode and a reflector provided on a substrate, the IDT electrode including a pair of comb-shaped electrodes;
the IDT electrode included in each of the two or more parallel arm resonators includes: a plurality of first electrode fingers and a plurality of second electrode fingers that are interdigitated with the first electrode fingers;
a direction connecting tips of the plurality of first electrode fingers and a direction connecting tips of the plurality of second electrode fingers intersect an elastic wave propagating direction;
the plurality of first electrode fingers and the plurality of second electrode fingers include at least one of third electrode finger having an electrode finger width at the tip wider than an electrode finger width at a center portion, and fourth electrode fingers having electrode finger widths at the tip less than or equal to an electrode finger width at a center portion; and
a ratio of a number of the fourth electrode fingers of the plurality of first electrode fingers and the plurality of second electrode fingers included in a parallel arm resonator closest to the common connection terminal among the two or more parallel arm resonators is higher than a ratio of a number of the fourth electrode fingers of the plurality of first electrode fingers and the plurality of second electrode fingers included in another or other parallel arm resonators among the two or more parallel arm resonators.

2. The multiplexer according to claim 1, wherein a number of the third electrode fingers included in the parallel arm resonator closest to the common connection terminal among the two or more parallel arm resonators is less than a number of the third electrode fingers included in the another or other parallel arm resonators among the two or more parallel arm resonators.

3. The multiplexer according to claim 1, wherein
the IDT electrode of the parallel arm resonator closest to the common connection terminal among the two or more parallel arm resonators does not include the third electrode finger; and
the IDT electrode of the another or other parallel arm resonators among the two or more parallel arm resonators includes the third electrode finger.

4. The multiplexer according to claim 1, wherein a direction connecting tips of the plurality of first electrode fingers and a direction connecting tips of the plurality of second electrode fingers do not cross each other.

5. The multiplexer according to claim 1, further comprising a first inductance element electrically connected to a connection path between an antenna connection terminal electrically connected to an antenna and the common connection terminal.

6. The multiplexer according to claim 1, further comprising a second inductance element electrically connected in series to a connection path between the common connection terminal and the first filter.

7. The multiplexer according to claim 1, wherein the first filter includes a ladder filter structure including the one or more series arm resonators and the two or more parallel arm resonators.

8. The multiplexer according to claim 1, wherein the first filter further includes a longitudinally-coupled filter structure provided on the first path.

9. The multiplexer according to claim 8, wherein the longitudinally-coupled filter structure is defined by two longitudinally-coupled filter portions that are electrically connected in parallel and that are electrically connected to the one or more series arm resonators.

10. The multiplexer according to claim 8, wherein the longitudinally-coupled filter structure includes five IDTs and two reflectors arranged at end portions thereof.

11. The multiplexer according to claim 1, wherein the substrate includes:
a piezoelectric layer including a main surface on which the IDT electrode is provided;
a high-acoustic-velocity supporting substrate in which an acoustic velocity of bulk waves propagating through the high-acoustic-velocity supporting substrate is higher than an acoustic velocity of elastic waves propagating through the piezoelectric layer; and
a low-acoustic-velocity film provided between the high-acoustic-velocity supporting substrate and the piezoelectric layer, in which an acoustic velocity of bulk waves propagating through the low-acoustic-velocity film is lower than an acoustic velocity of elastic waves propagating through the piezoelectric layer.

12. The multiplexer according to claim 1, wherein the multiplexer includes a first duplexer including two filters including the first filter, and a second duplexer.

13. The multiplexer according to claim 12, wherein the second duplexer includes the second filter.

14. A radio-frequency (RF) front-end circuit comprising:
the multiplexer according to claim 1; and
an amplifier circuit electrically connected to the multiplexer.

15. A communication apparatus comprising:
an RF signal processing circuit that processes a radio frequency signal transmitted and received by an antenna element; and
the radio-frequency (RF) front-end circuit according to claim 14, the RF front-end circuit transferring the radio frequency signal between the antenna element and the RF signal processing circuit.

16. The multiplexer according to claim 1, wherein the first filter is an unbalanced-input and unbalanced-output bandpass filter.

17. The multiplexer according to claim 1, wherein the parallel arm resonator includes a pair of reflectors sandwiching the comb-shaped electrodes in the elastic wave propagating direction.

18. The multiplexer according to claim 17, wherein each of the pair of reflectors includes a grating structure.

* * * * *